United States Patent [19]

Alter

[11] Patent Number: 5,045,966
[45] Date of Patent: Sep. 3, 1991

[54] METHOD FOR FORMING CAPACITOR USING FET PROCESS AND STRUCTURE FORMED BY SAME

[75] Inventor: Martin J. Alter, Los Altos, Calif.

[73] Assignee: Micrel Semiconductor, Sunnyvale, Calif.

[21] Appl. No.: 583,779

[22] Filed: Sep. 17, 1990

[51] Int. Cl.$^5$ .......................... H01G 4/06; H01L 21/70
[52] U.S. Cl. .................................... 361/313; 357/23.4; 437/43
[58] Field of Search ....................... 361/311, 312, 313; 357/22, 23.5, 23.4, 54, 15, 28, 42, 52; 437/41, 43, 44, 57; 427/38

[56] References Cited

U.S. PATENT DOCUMENTS

| | | | |
|---|---|---|---|
| 4,931,408 | 6/1990 | Hshieh | 357/23.4 X |
| 4,956,698 | 9/1990 | Wang | 357/16 X |
| 4,957,877 | 9/1990 | Tam et al. | 437/43 |

Primary Examiner—Donald A. Griffin
Attorney, Agent, or Firm—Skjerven, Morrill, MacPherson, Franklin & Friel

[57] ABSTRACT

A polysilicon or equivalent plate, to be used as an upper plate of the capacitor, is first formed over an oxide layer grown on a substrate. The length of the upper plate is made shorter than gate lengths of MOS transistors formed with the same process so that, after dopants are deposited into exposed regions of the substrate on both sides of the plate in a manner identical to forming self-aligned source and drain regions of an MOS transistor, the dopants will side-diffuse during drive-in and the diffused regions will be closely separated or merged under the plate. The resulting capacitor structure has a more stable capacitance with varying $V_{GS}$ levels than MOS transistors merely connected and used as capacitors and has a lower series resistance.

25 Claims, 5 Drawing Sheets

METHOD FOR FORMING CAPACITOR USING FET PROCESS AND STRUCTURE FORMED BY SAME

FIELD OF THE INVENTION

This invention relates to capacitors formed using integrated circuit manufacturing techniques and in particular to capacitors using a diffused region as one plate of the capacitor.

BACKGROUND OF THE INVENTION

Many methods using integrated circuit manufacturing techniques have been used to form capacitors. One such method first forms a highly doped region in a semiconductor substrate to act as a bottom conductive plate of a capacitor and later forms a conductive polysilicon or similar material plate overlying and insulated from the highly doped region to act as an upper plate of the capacitor. One such prior art method and structure is illustrated in FIGS. 1a and 1b.

Figure 1A:
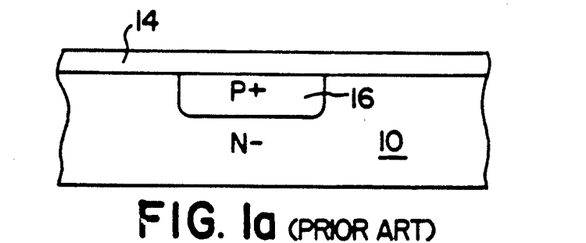
FIGS. 1a and 1b illustrate a prior art method for forming a high quality stable capacitor utilizing a highly doped diffused region as a bottom plate of a capacitor.

In FIG. 1a, N− substrate 10, which may be an epitaxial layer or the substrate itself, has formed on it dielectric 14, which may be silicon dioxide ($SiO_2$) or silicon nitride ($Si_3N_4$), having a thickness determined by the desired breakdown voltage and capacitance of the resulting capacitor. The wafer is patterned and a P−type dopant, such as boron, is then implanted into substrate 10 through dielectric 14. The dopants are then driven in to diffuse and activate the dopants to form highly conductive P+ region 16. P+ region 16 is sufficiently doped to ensure voltages applied to plate 18 in FIG. 1b do not deplete or invert region 16.

Dielectric layer 14 may also be grown after the implantation of the P−type dopants.

Figure 1B:
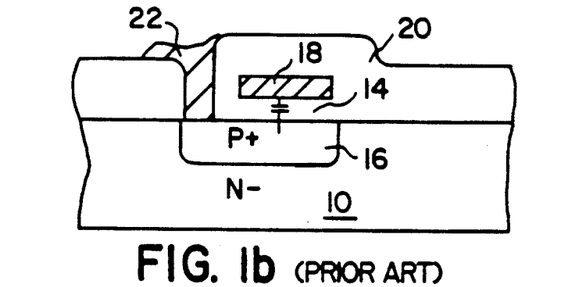

Next, as illustrated in FIG. 1b, a layer of doped polysilicon 18 is deposited over dielectric 14 and etched to form a top plate of the resulting capacitor over diffused region 16.

Insulating layer 20 is then deposited and flowed over the wafer, and metal contact 22 is formed to electrically contact P+ diffused region 16. Insulation layer 20 electrically insulates metal contact 22 from polysilicon plate 18. A separate contact (not shown) is also formed elsewhere on the wafer to contact conductive polysilicon plate 18.

The conductivity types in the example of FIGS. 1a and 1b may be made opposite to that shown while still forming a practical capacitor.

Figure 2A:
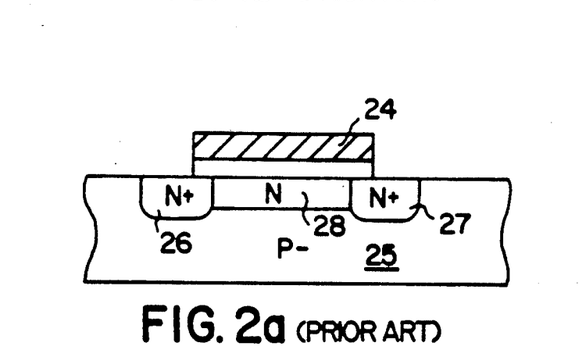
FIG. 2a shows a prior art depletion type MOS transistor which may be used as a capacitor.

FIG. 2a shows a depletion type MOS device, which may be used as a capacitor, whose channel conductivity is controlled by the gate/source voltage ($V_{GS}$). In FIG. 2a, the capacitor consists of polysilicon plate 24, P−substrate 25, N+ contact regions 26 and 27, and N−−channel region 28. The capacitance value of this device changes, however, with the level of $V_{GS}$, since negative values of $V_{GS}$ deplete and can invert channel region 28, thereby changing the effective area of the lower capacitor plate and the distance between the upper and lower capacitor plates.

Figure 2B:
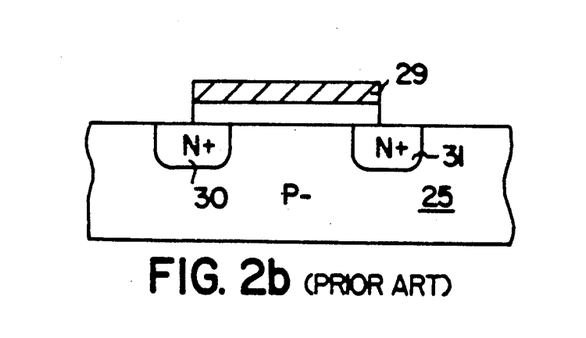
FIG. 2b shows a prior art enhancement type MOS transistor which may be used as a capacitor.

FIG. 2b shows an enhancement type MOS device, which may also be used as a capacitor. A positive $V_{GS}$ is required to cause the channel region under gate 29 to become conductive so as to act as a lower plate of the capacitor in conjunction with N+ contact regions 30 and 31. Thus, the capacitance of this device also varies with $V_{GS}$ in a way similar to that described with respect to the depletion type MOS device of FIG. 2a.

An additional drawback of the capacitors of FIGS. 2a and 2b is that for $V_{GS}$ values below a certain voltage, the channel region of the capacitors of FIGS. 2a and 2b causes the capacitors to have an undesirable high series resistance.

Since the capacitors of FIGS. 2a and 2b are identical to MOS transistors, no additional process steps are used to form these capacitors on a wafer containing identically formed MOS transistors. For this reason, these capacitors are often used, despite their shortcomings, in some non-critical applications.

As seen, the capacitor structures of FIGS. 2a and 2b have a number of drawbacks which the capacitor of FIG. 1b overcomes.

Although the method illustrated in FIGS. 1a and 1b results in a stable capacitor having a highly conductive diffused region as a bottom plate of the capacitor, it is more desirable to form this type of capacitor by using the same masks and process steps which are used for forming MOS transistors on the same wafer. In this more desirable prior art method, the same oxide layer grown for the dielectric of the capacitor is also used for the gate oxide in the MOS transistors. Further, the polysilicon plate of the capacitor is formed by the same steps used to form the polysilicon gates of the MOS transistors. In this more desirable prior art method, however, one extra patterning step and dopant deposition step is required, which is not used in a normal polysilicon gate MOS process, to form the highly doped diffused region, such as P+ region 16 in FIG. 1a, which will act as the bottom plate of the capacitor.

Figure 3A:
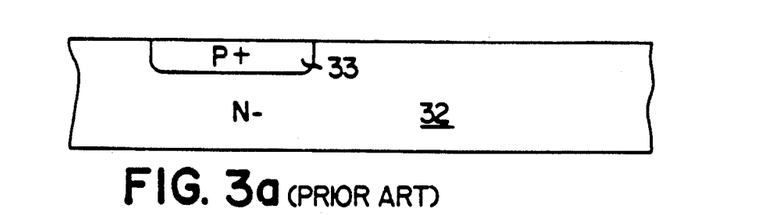
FIGS. 3a–3c illustrate one prior art method for forming a capacitor requiring one additional masking and doping step over that used to form a standard MOS transistor.
Figure 3B:
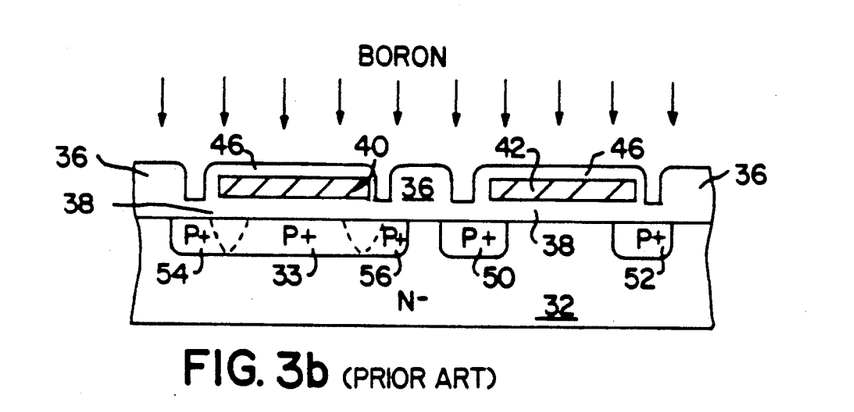
Figure 3C:
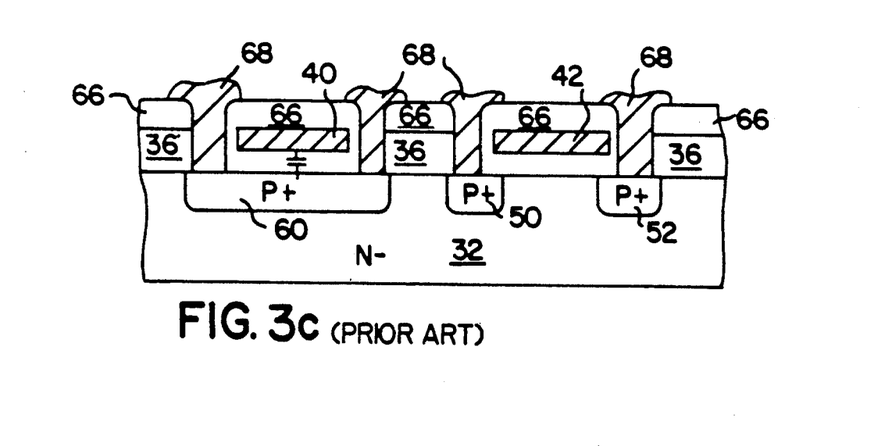

An example of such a process is shown in FIGS. 3a-3c.

As illustrated in FIG. 3a, the surface of N−substrate 32 is patterned, and P−type dopants, such as boron, are implanted or otherwise deposited into N−− substrate 32. Dopants may instead be implanted directly through a thin oxide layer, such as later formed oxide layer 38. The dopants are then driven in to form highly conductive P+ region 33.

Next, as shown in FIG. 3b, N− substrate 32 has grown on its top surface thick field oxide, which is then patterned to form thick oxide regions 36. Gate oxide layer 38 is then grown over the top surface of substrate 32. Oxide layer 38 acts as both the gate oxide for MOS transistors formed on the wafer and the dielectric of the resulting capacitor formed using the below-described procedures.

Also shown in FIG. 3b, polysilicon plate 40, typically doped with phosphorus to lower its resistivity, is formed on oxide layer 38 so that P+ region 33 extends out from under plate 40. At the same time, doped polysilicon gate 42, which will eventually be a gate of an MOS transistor, is also formed.

A thin layer of oxide 46 is then grown over the surface of the wafer, including over polysilicon 40 and 42, to help protect polysilicon 40 and 42 from being reverse doped with P−type dopants.

P−type boron ions are then implanted into the exposed regions of N− substrate 32 around polysilicon 40 and 42 to form source region 50 and drain region 52 self-aligned with respect to polysilicon gate 42 and to form contact regions 54 and 56 self-aligned with polysilicon plate 40 and P+ region 33. The boron ions are driven in at this time or at a later time, depending upon the junction depth desired.

As shown in FIG. 3c, insulating layer 66 is deposited over the surface of the wafer using a conventional process, such as a boron/phosphorus silicon glass (BPSG) technique, and flowed. This step may be preceded by a separate drive-in step for the boron ions. Insulating layer 66 is then selectively etched to form contact holes.

A metal deposition and etch process is then used to form metal contacts 68 for contacting the various diffused regions in N− substrate 32 and for contacting the various polysilicon regions.

In the structure of FIG. 3c, a capacitor is formed by polysilicon plate 40 and P+ diffused region 60, while a P−channel MOS transistor is formed by gate 42, source region 50, drain region 52, and a channel region under gate 42.

Thus, with only a single extra masking step and dopant implantation step to form P+ diffused region 33 in FIG. 3a, capacitors may be formed in a wafer along with MOS transistors.

What would be desirable to simplify the above process and reduce its cost is a method to form a polysilicon plate type capacitor using an MOS transistor type process without requiring any additional masking and deposition steps other than those used to form the MOS transistors themselves or used to form other components on the wafer utilizing diffused regions.

SUMMARY OF THE INVENTION

A novel method of forming a capacitor and the resulting structure is disclosed, wherein a capacitor having a stable capacitance (i.e., capacitance essentially not a function of $V_{GS}$) may be formed using only the process steps that are used for forming MOS transistors. Thus, forming the capacitor does not require any additional masking or dopant deposition steps and, hence, the capacitor may be made more simply and at less cost than prior art capacitors having similar operating characteristics.

This novel method utilizes the side-diffusion of deposited dopants during drive-in. In this novel process, a polysilicon, polycide, or equivalent plate, to be used as an upper plate of the capacitor, is first formed over an oxide layer. In one embodiment of the invention, the length of the upper capacitor plate is made short enough (e.g., less than four microns for a junction depth of three microns) so that, after dopants are implanted into exposed regions of the substrate on both sides of the plate in a manner identical to forming self-aligned source and drain regions of an MOS transistor elsewhere on the wafer, the dopants will side-diffuse during drive-in and substantially merge under the plate. The merged dopants under the plate form a continuous highly doped diffused region under the plate which may then be used as the stable bottom plate of the capacitor.

Actual merging of dopants under the plate is not necessary for this invention. Any side-diffusion of dopants under the plate resulting in a less than permissible source/drain separation for an operable MOS transistor on the wafer (given a predetermined maximum operating voltage) will form a capacitor which is improved over prior art capacitors having plate lengths equal to or greater than the gate lengths of MOS transistors.

By reducing the plate length, the percentage of the capacitance which is stable versus the percentage of the capacitance which varies as a function of $V_{GS}$ is increased, wherein maximum stability is achieved when the diffused regions merge under the plate.

Due to the less than permissible source/drain separation in the capacitors of this invention, these novel capacitors would have a relatively low breakdown voltage if connected for use as MOS transistors. However, since the capacitors of this invention would normally be connected with the source and drain shorted together, breakdown between the source and drain is not a concern.

Thus, MOS transistors and high quality capacitors may be formed using the exact same process with no additional masking or doping steps, except that the lengths of the capacitor plates will be less than the permissible lengths of gates in MOS transistors, given a specified operating voltage.

The maximum permissible length of the polysilicon or other equivalent conductive upper capacitor plate in this invention is dependent upon the side-diffusion of dopants after drive-in and, thus, may be virtually any length.

DETAILED DESCRIPTION OF THE PREFERRED EMBODIMENT

The preferred embodiment of forming a capacitor in accordance with the invention will be described along with steps used to form a P−channel and an N−channel enhancement type MOS transistors in a CMOS process. The capacitor will be formed with the identical steps used to form the P−channel transistor.

Figure 4:
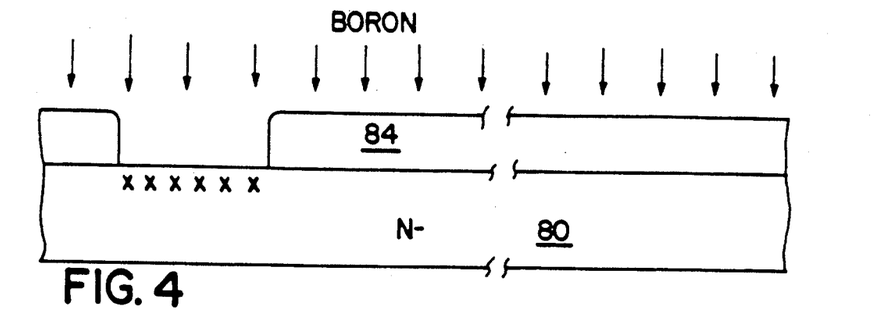
FIGS. 4–12 illustrate a preferred embodiment method for forming a capacitor along with an MOS transistor on a single substrate, wherein the capacitor is formed using only the masking and doping steps required to form the MOS transistor.

FIG. 4 illustrates a first step in this preferred embodiment method for forming a capacitor in a CMOS process. N− substrate 80 is shown in this example; however, this may also be an epitaxial layer and may also be of a P−type conductivity. In the preferred embodiment, N− substrate 80 has a dopant density of approximately $5 \times 10^{15}$ atoms/cm$^3$ (or a resistivity of approximately 1Ω-cm) and a crystal orientation of <100>.

Oxide layer 84 is then formed over N− substrate 80 to a thickness of approximately one micron by thermal oxidation. Oxide layer 84 may be any thickness sufficient to block the implantation of ions in a subsequent implantation step.

Oxide layer 84 is then patterned to expose the surface of substrate 80 in order to form a P−well for the body of an N−channel transistor.

Boron ions are then implanted at an energy of approximately 100 KeV and at a dosage of approximately $1 \times 10^{13}$ ions/cm$^2$.

Figure 5:
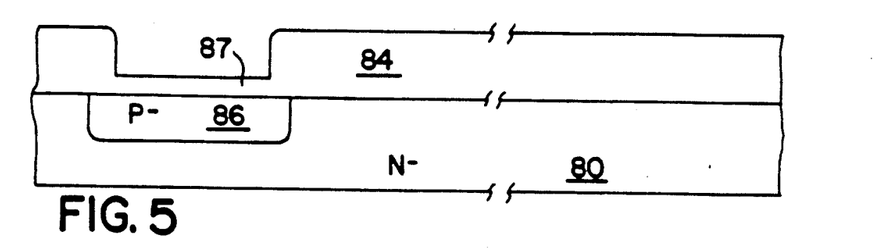

As shown in FIG. 5, the boron ions are driven in a dry O$_2$ or mixed N$_2$/O$_2$ atmosphere at approximately 1100° C. to achieve a junction depth of between 5 and 6 microns for P—well 86. The extent of drive-in is dependent upon the intended operating voltages. This drive-in process also forms a thin layer of oxide 87 over the wafer surface.

Figure 6:
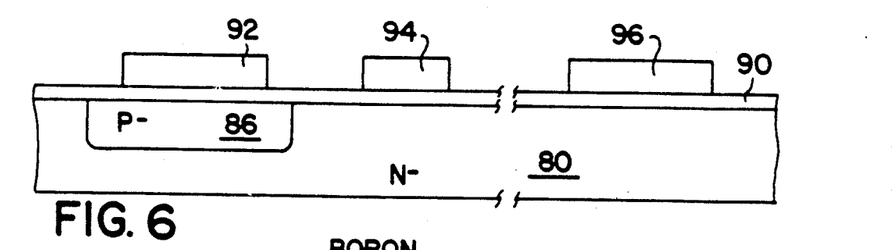

In FIG. 6, oxide 84 and 87 portions are then removed using a conventional wet etching process, and thin oxide layer 90 is grown on the surface of the wafer to between 200-800 Å by thermal oxidation to act as a pad on which nitride is subsequently deposited.

A thin nitride (Si$_3$N$_4$) layer is deposited over oxide layer 90 to a thickness of approximately 1,500 Å, using a low pressure chemical vapor deposition (CVD) process, and is then patterned and plasma etched using conventional techniques to form nitride regions 92, 94, and 96. The locations of nitride regions 92, 94, and 96 are selected based on the desired locations of polysilicon regions which will subsequently be formed. Nitride regions 92 and 96 will be utilized in forming an N—channel transistor and a P—channel transistor, respectively, while nitride region 94 will be utilized in forming a capacitor.

Figure 7:
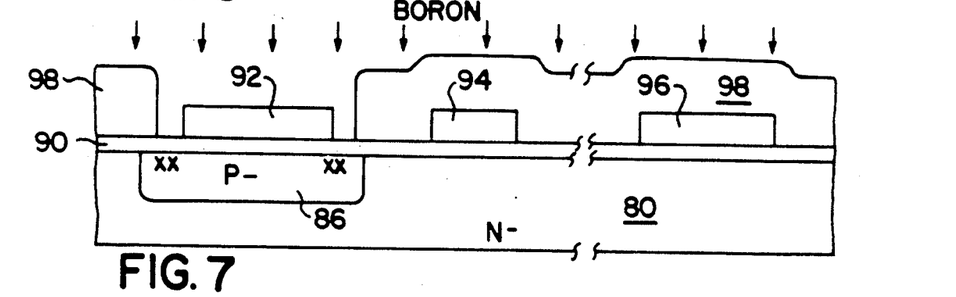

Next, as shown in FIG. 7, resist 98 is deposited on the surface of the wafer and patterned using conventional techniques to expose peripheral portions of P—well 86. Boron ions are then implanted at an energy of approximately 40 KeV and at a dosage of approximately $5 \times 10^{13}$ ions/cm$^2$. These boron ions will later be driven in to form highly doped peripheral regions 97 (shown in FIG. 8) in P—well 86 to prevent any undesired inversion of P—well 86 under field oxide 100 in FIG. 8.

Resist 98 is then completely removed using conventional techniques, and nitride regions 92, 94, and 96 are left remaining.

Figure 8:
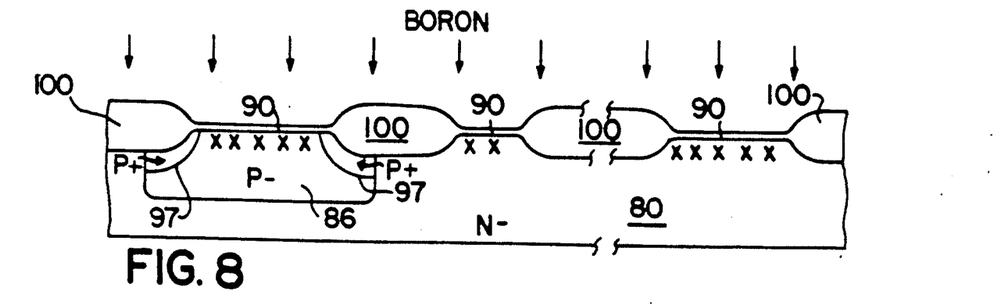

In FIG. 8, while nitride regions 92, 94, and 96 in FIG. 7 remain over oxide layer 90, the surface of substrate 80 is oxidized by thermal oxidation at approximately 1000° C. to form oxide regions 100 to a thickness of approximately one micron. Oxide will not grow under nitride regions 92, 94, and 96. Boron ions implanted in FIG. 7 are driven in during this oxidation step to form P+ channel stop regions 97.

Nitride regions 92, 94, and 96 are then removed using well known techniques.

Boron ions are then implanted at an energy of approximately 40 KeV and at a dosage of approximately $5 \times 10^{11}$ ions/cm$^2$ in order to raise the threshold of the N—channel transistor to be formed in P—well 86 and lower the threshold of the P—channel transistor to be formed on the right side of FIG. 8.

The preferred steps of implantation shown in FIGS. 7 and 8 may be deleted from this process in another embodiment.

Figure 9:
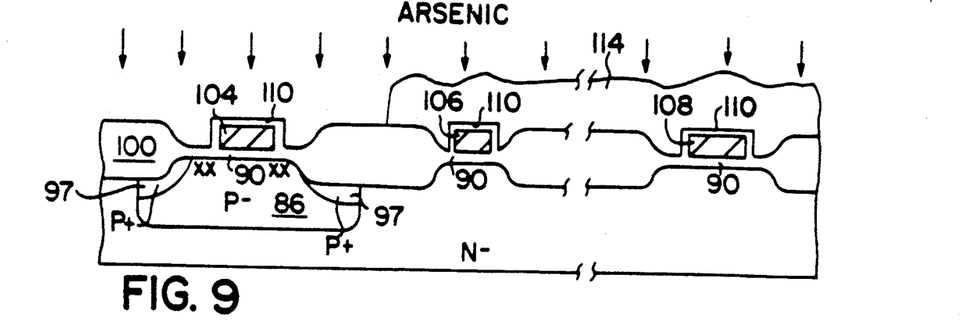

Next, as illustrated in FIG. 9, a layer of polysilicon is deposited over oxide 90 and 100 using a conventional process, such as a low pressure CVD process, to a thickness of approximately 5,000 Å. The polysilicon layer may be made thicker or thinner while still providing similar results. The polysilicon layer is then doped, or doped in situ, with phosphorus by placing the wafer in an atmosphere of POCl$_3$ at 950° C. for between 15-20 minutes to lower the resistivity of the polysilicon layer to approximately 15 ohms/square. The polysilicon layer is then patterned using conventional techniques to form polysilicon regions 104, 106, and 108 to selected geometries. In the preferred embodiment, the polysilicon layer is etched using an automatic dry etch apparatus which uses infrared detection to stop etching automatically when the exposed polysilicon is etched away, leaving underlying oxide 90 and 100 substantially intact.

Exposed polysilicon regions 104, 106, and 108 are then oxidized to form a layer of oxide 110 approximately 500 Å thick on their surfaces.

In the particular example shown in FIG. 9, polysilicon regions 104 and 108 are assumed to be approximately three microns in length and will be used as gates for an N—channel MOS transistor and a P—channel MOS transistor, respectively, having preselected source and drain junction depths of 0.5 microns. This three micron gate length and 0.5 micron junction depth is typically referred to as normal three micron CMOS silicon gate technology.

Polysilicon region 106 has a relatively short length of approximately two microns and will be used as an upper plate of a capacitor.

Figure 14:
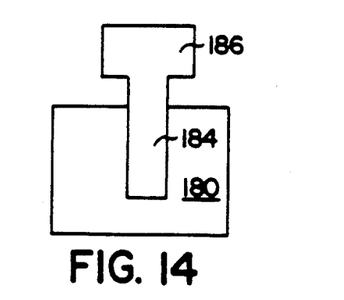
FIGS. 14–16 illustrate various geometries of the upper polysilicon or equivalent conductive plate of the formed capacitor.
Figure 15:
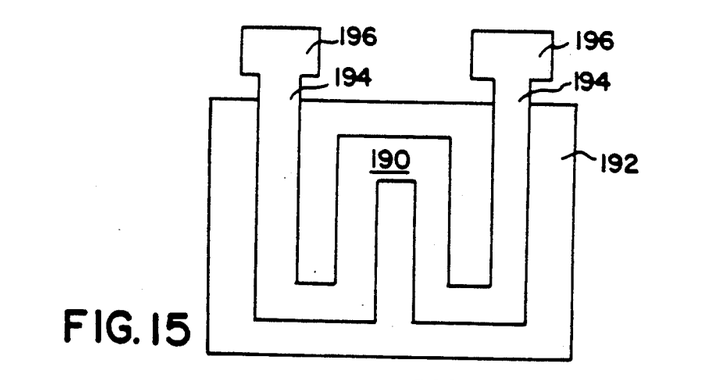
Figure 16:
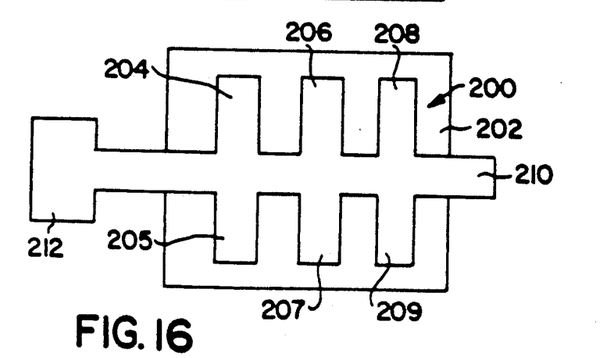

An upper capacitor plate may be formed using a linear single polysilicon strip, as shown in FIG. 9; however, other, more preferred, geometries for an upper plate of the capacitor may be used to achieve improved characteristics and are discussed with respect to FIGS. 14-16.

The MOS transistors formed on substrate 80 serve merely to provide an example of how the capacitor may be formed along with other types of electrical components without any additional masking or doping procedures. DMOS transistors, as well as bipolar transistors, diodes, and other components may also be formed in substrate 80 using standard techniques. The below-described implantation of dopants into substrate 80 to form the bottom plate of the capacitor may be conducted during the same implantation step used to form regions for any electrical component, not just MOS transistors.

Referring again to FIG. 9, a layer of resist 114 is deposited over the surface of the wafer and then patterned using conventional masking and etching techniques to expose the area around polysilicon region 104. N—type arsenic ions are then implanted to a depth of approximately 500 Å at an energy of 150 KeV and at a dosage of approximately $5 \times 10^{15}$ ions/cm$^2$. The implanted ions are self-aligned with polysilicon region 104. If a conventional predeposition process is to be used, the surface of substrate 80 on both sides of polysilicon region 104 should be first exposed using conventional techniques prior to predeposition.

The arsenic dopants during a subsequent drive-in step must not side-diffuse under polysilicon gate 104 to the extent that the silicon between the resulting source and drain regions breaks down (by punch-through) under the intended operating conditions.

A rough estimation of side-diffusion during drive-in is given as follows:

$$\text{Final Junction Depth} \times 0.7 = \text{Side-Diffusion} \qquad \text{(eq. 1)}$$

In the example of FIG. 9, it is assumed that the length of polysilicon gate 104 is three microns and the minimum separation between the source and drain is to be 2.3 microns to prevent breakdown, given a certain maximum intended operating voltage. Thus, in this example the maximum side-diffusion under the gate for the source region and drain region is 0.35 microns per region. Hence, using equation 1, the final junction depth for the source and drain regions is to be a maximum of 0.5 microns.

Figure 10:
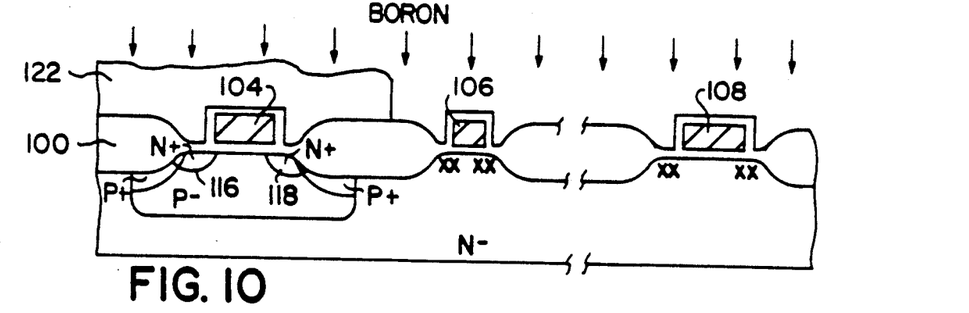

Accordingly, the arsenic ions in FIG. 9 are driven in to form junction depths of approximately 0.5 microns by, for example, heating the wafer in an $N_2$ or a mixed $N_2/O_2$ environment to 1000° C. for approximately 60 minutes or until the 0.5 micron junction depth is achieved. FIG. 10 shows N+ source and drain regions 116 and 118, respectively, formed after this drive-in step.

Next, as shown in FIG. 10, resist 114 is removed, and resist 122 is deposited and etched to expose areas surrounding polysilicon regions 106 and 108.

Boron is then implanted to a depth of approximately 3000 Å at an energy of 40 KeV and at a dosage of approximately $2 \times 10^{15}$ ions/cm$^2$ to implant P−type dopants self-aligned with polysilicon regions 106 and 108. Resist 122 is then removed.

No drive-in step is conducted at this stage, since a subsequent BPSG deposition step will require heating to flow and densify the BPSG layer, and this will also drive-in the boron ions to a depth of approximately 0.5 microns.

Importantly, the three-micron length of polysilicon region 108 is sufficient to cause the resulting P+ source and drain regions to be separated by the required minimum 2.3 microns to avoid breakdown by punch-through at the given maximum intended operating voltage. Thus, an operable P−channel MOS transistor will be formed using polysilicon region 108 as a gate.

In contrast, polysilicon region 106 is only two microns long, and the resulting 1.3 micron separation (using equation 1) between its self-aligned source and drain is insufficient to prevent breakdown by punch-through. But, since polysilicon region 106 will be used as an upper plate of a capacitor and the self-aligned source and drain regions will be shorted together, breakdown between the source and drain is not a concern.

Thus, an operable P−channel MOS transistor and an improved capacitor, having lower series resistance than prior art capacitors formed with MOS transistors, will be formed after drive-in using identical process steps.

Figure 11:
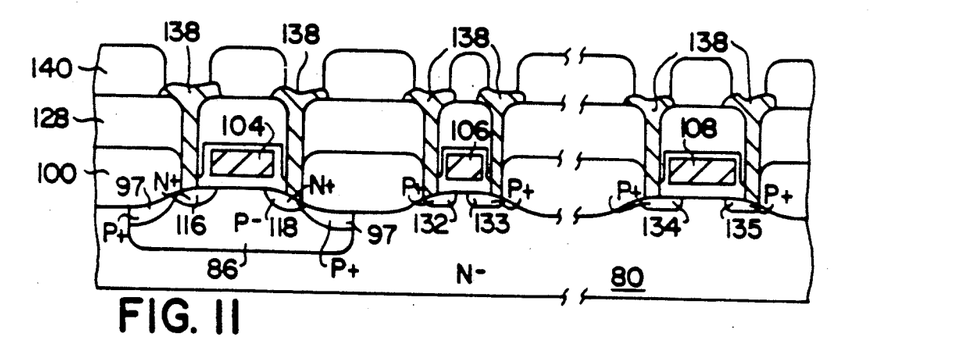

As illustrated in FIG. 11, BPSG layer 128, approximately one micron thick, is deposited using low pressure CVD, and this BPSG layer 128 is heated to a temperature of approximately 900° C. in an atmosphere of $N_2$ for approximately 30 minutes to densify and smooth out BPSG layer 128. This heating step also drives in the implanted boron dopants to form P+capacitor regions 132 and 133, source region 134, and drain region 135, all having a depth of approximately 0.5 microns. This heating step also very slightly further drives in the arsenic dopants.

The wafer is again patterned, and contact holes are formed in BPSG 128 in order to contact the various diffused regions and polysilicon regions.

Metal, such as AlSi or AlSiCu, is then deposited and selectively etched to form the various metal contacts 138 to contact associated diffused regions in substrate 80. Metal contacts for contacting the various polysilicon regions are not shown. Contacts 138 may be in other more desirable locations on the wafer to contact the various diffused regions and are shown in the cross-section of FIG. 11 for simplicity.

The structure of FIG. 11 is then passivated using a nitride plasma (or other equivalent passivation process) to form nitride layer 140 to provide scratch protection and prevent migration of sodium and other contaminants into the resulting semiconductor structure. Nitride layer 140 is then patterned to expose pads for contacts 138.

Figure 12:
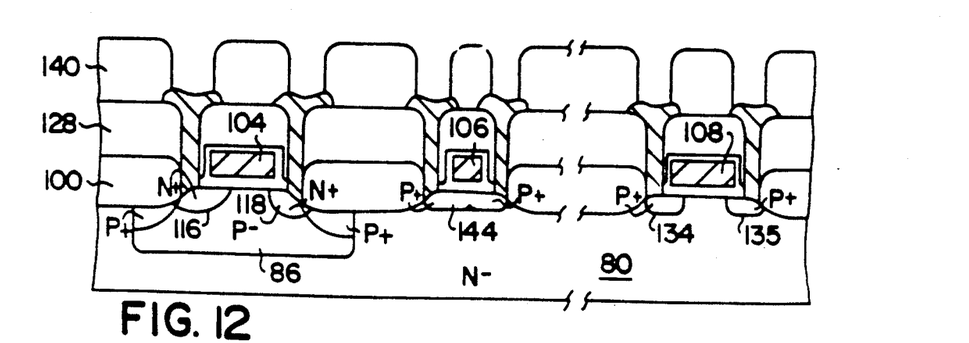

In another embodiment of the invention, the side-diffusion of dopants under the upper capacitor plate causes the junctions to merge so as to form a continuous high conductivity region under the upper capacitor plate. This is shown in FIG. 12, where the side-diffusion of the implanted boron ions during the flowing of BPSG 128 results in merged diffused region 144. All process steps to form the structure of FIG. 12 are identical to those used to form the structure of FIG. 11 except, in order to merge the two junctions self-aligned with polysilicon region 106, polysilicon region 106 in FIG. 12 must be shorter than polysilicon region 106 in FIG. 11 and/or the junction depth of P+ region 144 must be sufficiently greater than the 0.5 micron junction depth of P+ contact regions 132 and 133 in FIG. 11 to cause the necessary side-diffusion in accordance with equation 1.

As is apparent, a lesser separation between diffused regions under the capacitor plate increases the capacitance value and also results in a more stable capacitance with changing $V_{GS}$ levels.

To form a higher voltage capacitor in accordance with this invention, deep junctions (e.g., one to six microns deep) are formed self-aligned with the capacitor plate, whether or not these deep junctions are intended to actually merge under the plate during a drive-in step. In one embodiment, a separate implant (or predeposition) step and drive-in step are used to form these deep junctions prior to forming any shallow junctions, such as shallow junctions 116, 118, 134, and 135 in FIGS. 11 and 12, so that shallow junction implants may also serve to further dope the deep junctions and so the drive-in of the shallow junctions can be more carefully controlled and limited.

Forming these deep junctions for the capacitor may be performed simultaneously with forming deep junctions for other devices, not just MOS transistors.

Due to the relatively large side-diffusion of dopants when forming deep junctions, the capacitor plate may be made relatively long (e.g., greater than three microns) while still obtaining the benefits of this invention.

Figure 13:
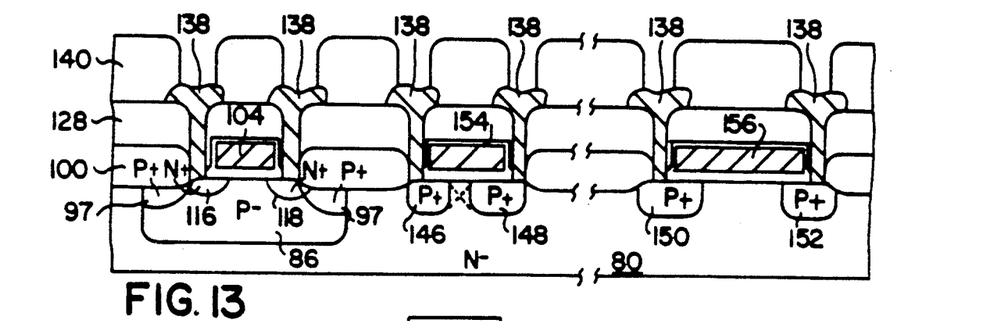
FIG. 13 illustrates a capacitor and MOS transistor formed using the preferred embodiment method but utilizing deep junctions.

FIG. 13 shows one embodiment of a capacitor having deep junctions 146 and 148, which may or may not be merged, wherein deep junctions 146 and 148 are formed simultaneously with deep junctions 150 and 152, acting as source and drain regions, respectively, for an N−channel MOS transistor.

Merging of deep junctions 146 and 148 is illustrated by the overlapped dashed lines in FIG. 13 and may be achieved by making capacitor plate 154 sufficiently short.

Deep junctions 146, 148, 150, and 152 are formed in a manner similar to forming the shallow junctions 132, 133, 134, and 135 of FIG. 11 but using a higher energy implantation process and/or a deeper drive-in process. Methods of obtaining desired junction depths are well known in the art.

As seen in FIG. 13, capacitor plate 154 and MOS transistor gate 156 are longer than the corresponding plate 106 and gate 108 of FIGS. 11 and 12. This allows the source and drain of the resulting MOS transistor to be relatively widely separated while still having deep junctions to form a device which has a relatively high breakdown voltage, as is well known in the art. Although the separation of the deep junctions is not a concern for the capacitor, the deep junctions allow the use of higher voltage levels and enables larger plate areas.

As in FIGS. 11 and 12, plate 154 of the capacitor is shorter than the permissible gate length of gate 156 for the intended operating voltage in order to achieve the benefits of this invention.

The structures of FIGS. 11, 12, and 13 may all be formed on the same wafer. The various junction depths and polysilicon region lengths depend on the desired operating characteristics of the devices to be formed. Polysilicon gates and plates may extend beyond eight microns in length or be less than one micron, depending upon the junction depths and operating voltages to be used.

It is to be noted that the capacitor formed in the illustrated process need not be isolated from other devices but may share a diffused region with an MOS transistor. Further, the polysilicon, polycide, or equivalent plate of the capacitor may be made common with other capacitor plates or gates of one or MOS transistors. Implantation of dopants to form the bottom plate(s) of the capacitor may be conducted during any implantation step used to form regions in any other device while still retaining all the benefits of this invention.

All conductivity types described in the illustrated process above may be opposite conductivity types, wherein substrate 80 may be of a P—type and the various diffused regions formed may be of an N—type or P—type. Also, the capacitor may or may not be formed within a well.

Additionally, the various regions need not be formed self-aligned with the polysilicon regions to obtain the benefit of this invention, and any conventional technique may be used to form the various diffused and polysilicon regions.

FIGS. 14-16 relate to geometries of the polysilicon or equivalent capacitor plate which may be used to achieve various advantages.

Capacitance is calculated using the equation:

$$C = AK\epsilon_0/t, \quad \text{(eq. 2)}$$

where
C is the capacitance
$\epsilon_0$ is the permittivity of empty space ($8.85 \times 10^{-2}$ coul$^2$/newton$^2$—m$^2$)
K is the dielectric constant (3.9 for SiO$_2$)
A is the plate area, and
t is the dielectric thickness.

Thus, as seen by equation 2, the area of the upper conductive capacitor plate overlying the highly doped diffused region(s), forming the bottom plate of the capacitor, is directly related to the capacitance.

FIG. 14 shows one embodiment of a capacitor formed using this invention, where highly doped diffused region 180 is shown with conductive plate 184 overlying and insulated therefrom. Plate 184 may terminate with a relatively large terminal pad 186 for facilitating electrical contact of plate 184 with a metal contact during metallization.

In the geometry of FIG. 14, only a limited practical upper plate area is obtainable with such a linear plate 184, and the resulting capacitance is directly related to the alignment of the region 180 mask with respect to plate 184.

An improvement to this structure is shown in FIG. 15, which illustrates how plate 190 may be formed over diffused region 192 in a switchback or snake-like pattern to maximize the percentage of plate area per die area. Using this technique, however, may result in a capacitance value which is highly dependent upon the relative positioning of the region 192 mask with respect to plate 190. This is because the amount of area of leads 194, which partially overlap diffused region 192 and connect plate 190 to terminal pads 196, changes with the region 192 mask alignment. This is also a problem with the geometry of plate 184 in FIG. 14, where the capacitance of the resulting capacitor changes as pad 186 is located at varying distances from diffused region 180.

One way of avoiding this change in capacitance with mask tolerances is illustrated in the geometry of FIG. 16. In FIG. 16, plate 200 overlies diffused region 202. Plate 200 includes extensions 204-209 which increase the area of plate 200 over diffused region 202. Any number of extensions may be incorporated as necessary to achieve a desired capacitance. Importantly, a terminal portion 210 of plate 200 is designed to extend beyond diffused region 202. Thus, although variations in the alignment of the region 202 mask may cause terminal pad 212 to be closer to or farther away from diffused region 202, this variation will be compensated by the increased or decreased area of portion 210 over diffused region 202. Thus, the geometry of FIG. 16 compensates for differences in mask alignment to achieve a predictable capacitance.

The distance between adjacent extensions 204-209 can be any amount, although in the preferred embodiment this distance is approximately two microns.

The teachings in this disclosure may be broadly applied to form separated or merged diffused regions under a polysilicon or equivalent plate.

The teachings of this invention find high applicability in forming capacitors using an MOS transistor fabrication process; however, the teachings of this invention may be also used where appropriate to form any type of device, not just capacitors, which can utilize closely spaced or merged diffused regions under a conductive plate.

Geometries of the various diffused regions and conductive layers used to form structures with this inventive method will of course depend upon the desired operating characteristics of the resulting structures. Further, the geometries of the plate and diffused regions are not limited to rectilinear geometries.

While particular embodiments of the present invention have been shown and described, it will be obvious to those skilled in the art that changes and modifications may be made without departing from this invention in its broader aspects and, therefore, the appended claims are to encompass within their scope all such changes and modifications as falling within the true spirit and scope of this invention.

What is claimed is:

1. A method of forming a capacitor on a same substrate as an MOS transistor comprising the steps of:
   forming a dielectric layer over a top surface of a substrate of a first conductivity type;
   forming a conductive plate over said dielectric layer;
   depositing dopants of a second conductivity type into said substrate to form bottom plate regions in said substrate aligned with peripheral portions of said plate;

driving in said dopants such that said dopants within said bottom plate regions side-diffuse under said plate, said plate having a length less than a permissible gate length of a lateral MOS transistor if said MOS transistor was formed in said substrate so as to have source and drain junction depths substantially equal to junction depths of said bottom plate regions after said step of driving in said dopants, given a specified operating voltage for said MOS transistor and said capacitor; and electrically connecting said bottom plate regions and said plate within a circuit so as to act as a capacitor in said circuit, wherein said dielectric is of a thickness to not allow tunnelling of electrons through said dielectric under said specified operating voltage for said capacitor.

2. The method of claim 1 wherein said plate acts as a mask during said step of depositing dopants so that said dopants are deposited in said substrate in regions which are self-aligned with said plate.

3. The method of claim 1 wherein said dopants are deposited in said substrate in a manner such that when said dopants are driven in, said dopants will side-diffuse an amount approximately equal to or greater than one half a length of said plate so that regions formed on opposite sides of said plate will substantially merge under said plate.

4. The method claim 3 wherein said length of said plate is between approximately 1 micron to 8 microns.

5. The method of claim 3 wherein said length of said plate is approximately between 1 micron to 4 microns.

6. The method of claim 1 wherein said length of said plate is substantially constant along an entire width of said plate.

7. The method of claim 1 wherein said conductive plate is doped polysilicon.

8. The method of claim 1 wherein said conductive plate is polycide.

9. The method of claim 1 further comprising the steps of contacting said bottom plate regions under said plate with electrodes and shorting together said bottom plate regions.

10. The method of claim 1 wherein said plate is linear.

11. The method of claim 1 wherein said plate is formed in a switchback pattern.

12. The method of claim 1 wherein said step of depositing dopants is conducted using an implantation process.

13. The method of claim 1 wherein said length of said plate is between approximately 2 microns to 8 microns.

14. A method of forming an electrical structure comprising the steps of:

forming a dielectric layer over a top surface of a substrate;

forming a conductive plate over said dielectric layer;

depositing dopants into said substrate to form bottom plate regions in said substrate aligned with peripheral portions of said plate; and driving in said dopants such that said dopants within said bottom plate regions side-diffuse under said plate, said plate having a length less than a permissible gate length of an MOS transistor if formed in said substrate so as to have source and drain junction depths substantially equal to junction depths of said bottom plate regions after said step of driving in said dopants, given a specified operating voltage for said MOS transistor and said electrical structure, wherein said plate is formed to have a linear portion and one or more extensions extending from said linear portion, said linear portion having one or more terminal portions which extend beyond said bottom plate regions after said step of driving in said dopants to allow variations in mask alignments without affecting a total area of said plate over said bottom plate regions.

15. The method of claim 14 wherein said extensions extend substantially perpendicularly from said linear portion.

16. A method of forming a capacitor on a same substrate as an MOS transistor comprising the steps of:

forming a dielectric layer over a top surface of a substrate of a first conductivity type;

forming a conductive plate over said dielectric layer;

depositing dopants of a second conductivity type into said substrate to form bottom plate regions in said substrate aligned with peripheral portions of said plate;

driving in said dopants such that said dopants within said bottom plate regions side-diffuse under said plate and cause one or more of said bottom plate regions to substantially merge with one or more other bottom plate regions so as to substantially form a continuous bottom plate region extending under said plate;

electrically connecting said bottom plate regions and said plate within a circuit to act as a capacitor within said circuit, wherein said dielectric is of a thickness to not allow tunnelling of electrons through said dielectric under a specified operating voltage for said capacitor.

17. The method of claim 16 wherein a length of said plate is between approximately 2 microns to 8 microns.

18. The method of claim 16 wherein said plate is formed in a switchback pattern.

19. A capacitor formed on a same substrate as an MOS transistor, said capacitor comprising:

a conductive plate formed over and insulated from a top surface of a substrate of a first conductivity type by a dielectric; and a diffused region of a second conductivity type formed on and below said top surface of said substrate, a portion of said diffused region underlying said conductive plate, said portion underlying said conductive plate being formed by the side-diffusion of dopants from two or more separate regions merging under said conductive plate so as to form a substantially continuous merged region, dopants within said merged region being deposited in said substrate after the formation of said conductive plate;

said merged region and said plate being electrically connected within a circuit to act as a capacitor within said circuit, wherein said dielectric is of a thickness to not allow tunnelling of electrons through said dielectric under a specified operating voltage for said capacitor.

20. The structure of claim 19 wherein said conductive plate is doped polysilicon.

21. The structure of claim 19 wherein a length of said plate is between approximately 2 microns to 8 microns.

22. The structure of claim 19 wherein said plate is formed in a switchback pattern.

23. A capacitor formed on a same substrate as an MOS transistor, said capacitor comprising:
- a conductive plate formed over and insulated from a top surface of a substrate of a first conductivity type by a dielectric;
- one or more diffused bottom late regions of a second conductivity type formed on and below said top surface of said substrate, a portion of each of said diffused bottom plate regions underlying said conductive plate, said portion underlying said conductive plate being formed by the side-diffusion of dopants,
- said dopants being deposited in said substrate after the formation of said conductive plate,
- said conductive plate having a length less than a permissible gate length of a lateral MOS transistor if said MOS transistor was formed in said substrate so as to have source and drain junction depths substantially equal to junction depths of said diffused bottom plate regions, given a specified operating voltage for said MOS transistor and said capacitor,
- said bottom plate regions and said plate being electrically connected within a circuit to act as a capacitor within said circuit,
- wherein said dielectric is of a thickness to not allow tunnelling of electrons through said dielectric specified operating voltage for said capacitor.

24. The structure of claim 23 wherein said length of said plate is between approximately 2 microns to 8 microns.

25. The structure of claim 23 wherein said plate is formed in a switchback pattern.

* * * * *